United States Patent
Araoka et al.

(10) Patent No.: US 9,906,747 B2
(45) Date of Patent: Feb. 27, 2018

(54) SOLID-STATE IMAGING DEVICE AND IMAGING SYSTEM HAVING A PLURALITY OF UNIT PIXEL REGIONS

(71) Applicant: CANON KABUSHIKI KAISHA, Tokyo (JP)

(72) Inventors: Yukio Araoka, Hiratsuka (JP); Yoichiro Handa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/626,356

(22) Filed: Feb. 19, 2015

(65) Prior Publication Data

US 2015/0244959 A1 Aug. 27, 2015

(30) Foreign Application Priority Data

Feb. 25, 2014 (JP) ................................ 2014-033925

(51) Int. Cl.
*H04N 5/378* (2011.01)
*H04N 5/376* (2011.01)
*H04N 5/374* (2011.01)
*H04N 5/3745* (2011.01)
*H01L 27/146* (2006.01)

(52) U.S. Cl.
CPC ....... *H04N 5/378* (2013.01); *H01L 27/14643* (2013.01); *H04N 5/376* (2013.01); *H04N 5/3745* (2013.01)

(58) Field of Classification Search
CPC ...... H04N 5/378; H04N 5/376; H04N 5/3745; H04N 5/365; H04N 5/225
See application file for complete search history.

(56) References Cited

U.S. PATENT DOCUMENTS

| 5,955,753 A * | 9/1999 | Takahashi | H01L 27/14609 257/231 |
| 6,952,228 B2 * | 10/2005 | Yoneda | H01L 27/14603 348/304 |
| 8,902,342 B2 | 12/2014 | Araoka et al. | |
| 2002/0067416 A1 * | 6/2002 | Yoneda | H01L 27/14603 348/304 |
| 2002/0113888 A1 * | 8/2002 | Sonoda | H01L 27/14601 348/315 |

(Continued)

FOREIGN PATENT DOCUMENTS

JP S6359254 A 3/1988
JP S63185281 A 7/1988

*Primary Examiner* — Abdelaaziz Tissire
(74) *Attorney, Agent, or Firm* — Fitzpatrick, Cella, Harper & Scinto

(57) ABSTRACT

A solid-state imaging device includes a plurality of pixels arranged in a matrix, wherein one pixel of the plurality of pixels is arranged in one unit pixel region of a plurality of unit pixel regions, a plurality of sub vertical output lines, each of which outputs pixel signals from the plurality of pixels in the same pixel column, and a plurality of block select circuits provided in one-to-one correspondence with the plurality of sub vertical output lines. A load capacitance connected to a main vertical output line is reduced by connecting the plurality of sub vertical output lines and the main vertical output line via the plurality of block select circuits. This makes high-speed pixel signal readout possible.

12 Claims, 10 Drawing Sheets

(56) References Cited

U.S. PATENT DOCUMENTS

| | | | |
|---|---|---|---|
| 2006/0214086 A1* | 9/2006 | Fukushima | H01L 27/1464 250/208.1 |
| 2006/0221414 A1* | 10/2006 | Yukawa | H04N 3/1562 358/513 |
| 2006/0227228 A1* | 10/2006 | Nam | H04N 5/347 348/272 |
| 2008/0258047 A1* | 10/2008 | Sakakibara | G01J 1/44 250/214 C |
| 2009/0021625 A1* | 1/2009 | Sowa | H04N 3/155 348/308 |
| 2009/0053848 A1* | 2/2009 | Fan | H01L 27/14603 438/59 |
| 2009/0179141 A1* | 7/2009 | Sarig | H01L 27/14643 250/208.1 |
| 2010/0128148 A1* | 5/2010 | Yamauchi | H04N 5/357 348/241 |
| 2010/0271523 A1* | 10/2010 | Hara | H04N 5/367 348/302 |
| 2010/0328478 A1* | 12/2010 | Tanaka | H01L 27/14676 348/222.1 |
| 2013/0107093 A1* | 5/2013 | Aoki | H04N 5/3745 348/302 |
| 2014/0078354 A1* | 3/2014 | Toyoguchi | H01L 27/14603 348/246 |
| 2014/0375859 A1* | 12/2014 | Ono | H01L 27/14601 348/308 |
| 2015/0009371 A1 | 1/2015 | Araoka | |
| 2015/0009385 A1 | 1/2015 | Tsukida et al. | |
| 2015/0029375 A1* | 1/2015 | Sugawa | H04N 5/3575 348/308 |
| 2015/0029376 A1* | 1/2015 | Sugawa | H04N 5/378 348/308 |
| 2015/0181140 A1* | 6/2015 | Onishi | H04N 5/361 348/243 |
| 2015/0215561 A1* | 7/2015 | Maehashi | H04N 5/3745 348/273 |
| 2016/0219237 A1* | 7/2016 | Kobayashi | H04N 5/3696 |

\* cited by examiner

LAYOUT

CIRCUIT DIAGRAM

SOLID-STATE IMAGING DEVICE AND IMAGING SYSTEM HAVING A PLURALITY OF UNIT PIXEL REGIONS

BACKGROUND OF THE INVENTION

Field of the Invention

The present invention relates to a solid-state imaging device and an imaging system using the same.

Description of the Related Art

An example of an obstructive factor which makes it difficult to increase the readout rate of a pixel signal in a solid-state imaging device is the load of a vertical output line, which is increased by the parasitic capacitances of a number of pixel select transistors connected to the vertical output line. To solve this problem, a method of driving the vertical output line by hierarchizing it has been proposed. In Japanese Laid-open Patent Publication No. S63-185281, the vertical output line is divided into a main vertical output line (first vertical output line) and a sub vertical output line (second vertical output line), the main and sub vertical output lines are connected via switches, and a pixel signal is output to the main vertical output line via the sub vertical output line and the switch.

Unfortunately, Japanese Laid-open Patent Publication No. S63-185281 describes only an equivalent circuit diagram, and has not disclosed any practical implementation method.

SUMMARY OF THE INVENTION

The present invention has been made in consideration of the above situation, and provides a method suited to hierarchizing the vertical output line of a solid-state imaging device.

According to one aspect of the present invention, there is provided a solid-state imaging device including a plurality of pixels arranged in a matrix, wherein one pixel of the plurality of pixels is arranged in one unit pixel region of a plurality of unit pixel regions, a plurality of first vertical output lines, each of which outputs pixel signals from the plurality of pixels in the same pixel column, a plurality of select circuits provided respectively for the plurality of first vertical output lines, and a second vertical output line connected to the plurality of first vertical output lines via the plurality of select circuits, wherein the select circuits are provided in a part of the plurality of unit pixel regions.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A first embodiment of the present invention will be explained below.

Figure 1:
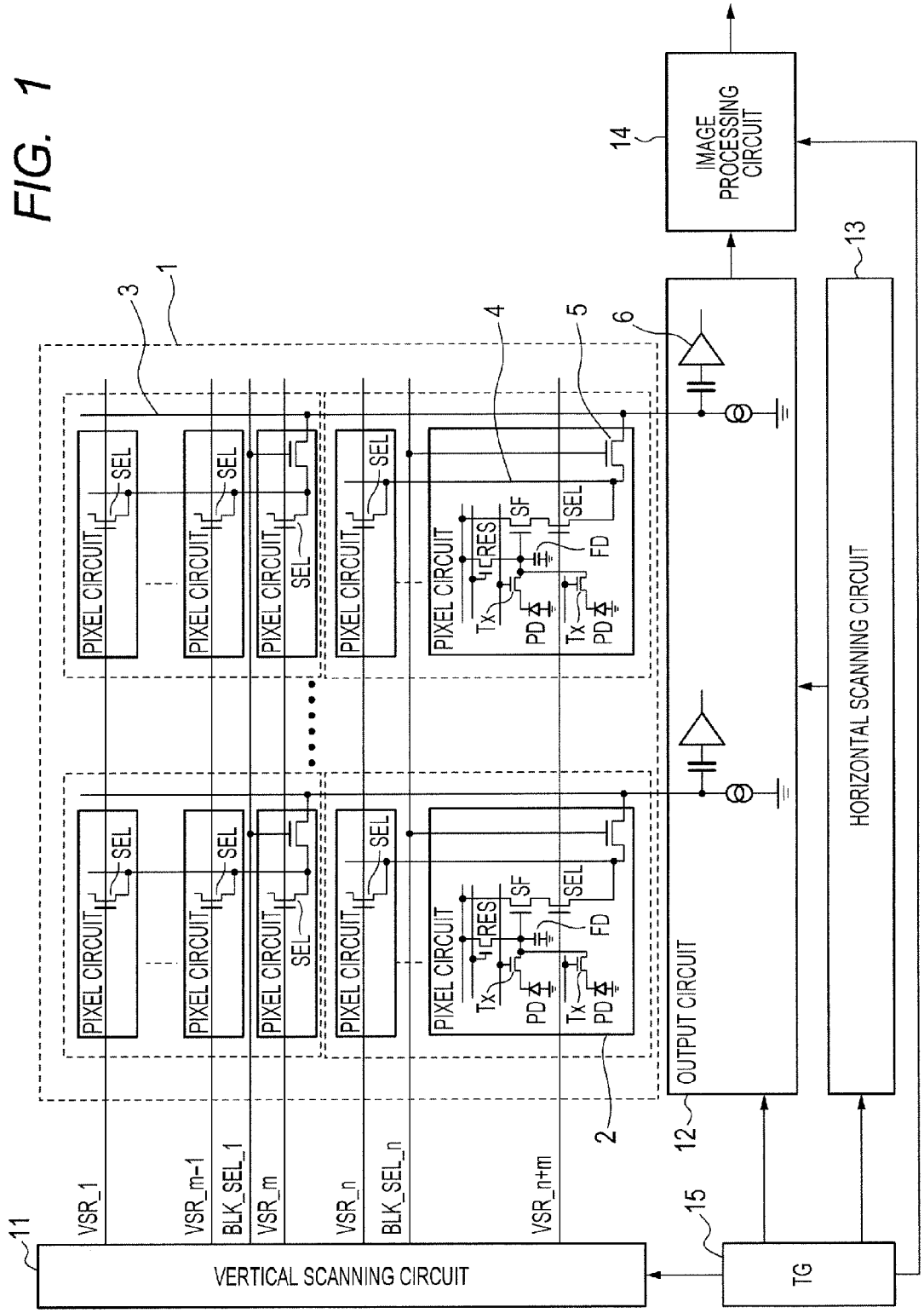
FIG. 1 is a view illustrating an arrangement example of a solid-state imaging device according to a first embodiment.

FIG. 1 is a view illustrating an arrangement example of a solid-state imaging device according to the first embodiment. A plurality of pixels are arranged in a two-dimensional array (a matrix) in a pixel array (pixel region) 1 of the solid-state imaging device. The pixel includes a pixel circuit 2. A region where each pixel circuit 2 is provided is also called a unit pixel region. A plurality of unit pixel regions are arranged in the matrix. The pixel circuit 2 includes a photodiode (photoelectric conversion element) PD, a transfer transistor TX, a floating diffusion capacitor FD, a source follower transistor (amplifier transistor) SF, a pixel select transistor SEL, and a reset transistor RES.

A plurality of pixel circuits 2 in the vertical direction (a plurality of pixel circuits 2 in the same column) are divided into a plurality of groups, and the pixel circuits belonging to each group are connected to a sub vertical output line (first vertical output line) 4, thereby forming blocks. The output from each pixel circuit 2 is output to a main vertical output line (second vertical output line) 3 via the sub vertical output line 4 and a block select circuit 5 formed in the pixel circuit 2, and output to an amplifier 6 of an output circuit 12. The block select circuit 5 connects the sub vertical output line 4 to the main vertical output line 3, when its own block is selected. In this embodiment, the plurality of pixel circuits 2 are divided into blocks, so some pixel circuits 2 include the block select circuit 5. FIG. 1 illustrates only the pixel select transistor SEL and the block select circuit 5 except for some pixel circuits.

A vertical scanning circuit 11 performs control for reading out pixel signals from the pixel circuits 2 in the pixel array 1 in order in the vertical direction. In the output circuit 12, the amplifier 6 for reading out a pixel signal from the pixel circuit 2 of the pixel array 1 and amplifying the readout signal is arranged for each column of the pixel array 1. A horizontal scanning circuit 13 sequentially outputs the readout pixel signals from the output circuit 12 to an image processing circuit 14. The image processing circuit 14 performs image processing on the input pixel signals. A timing generator (TG) 15 outputs control signals, thereby controlling the vertical scanning circuit 11, output circuit 12, horizontal scanning circuit 13, and image processing circuit 14.

As illustrated in FIG. 1, blocks are formed by connecting the plurality of pixel circuits 2 to the sub vertical output line 4, and the main vertical output line 3 and sub vertical output line 4 are connected via the block select circuit 5. In this arrangement, the parasitic capacitances of pixel select transistors of all pixels connected to a vertical output line in the related art are reduced to only the parasitic capacitance of the transistor of the block select circuit 5. Thus, the load capacitance of the main vertical output line 3 is reduced, whereby high-speed pixel signal readout is possible.

Note that this embodiment shows only a case in which the number of stages of the block select circuits 5 is one, but the number of stages of hierarchization and the number of divisions of hierarchical blocks are not particularly limited. Note also that a switching circuit using a transistor is shown as the block select circuit 5 in the example illustrated in FIG. 1, but it is also possible to use, e.g., a source follower circuit or a buffer circuit using a differential amplifier.

Figure 2:
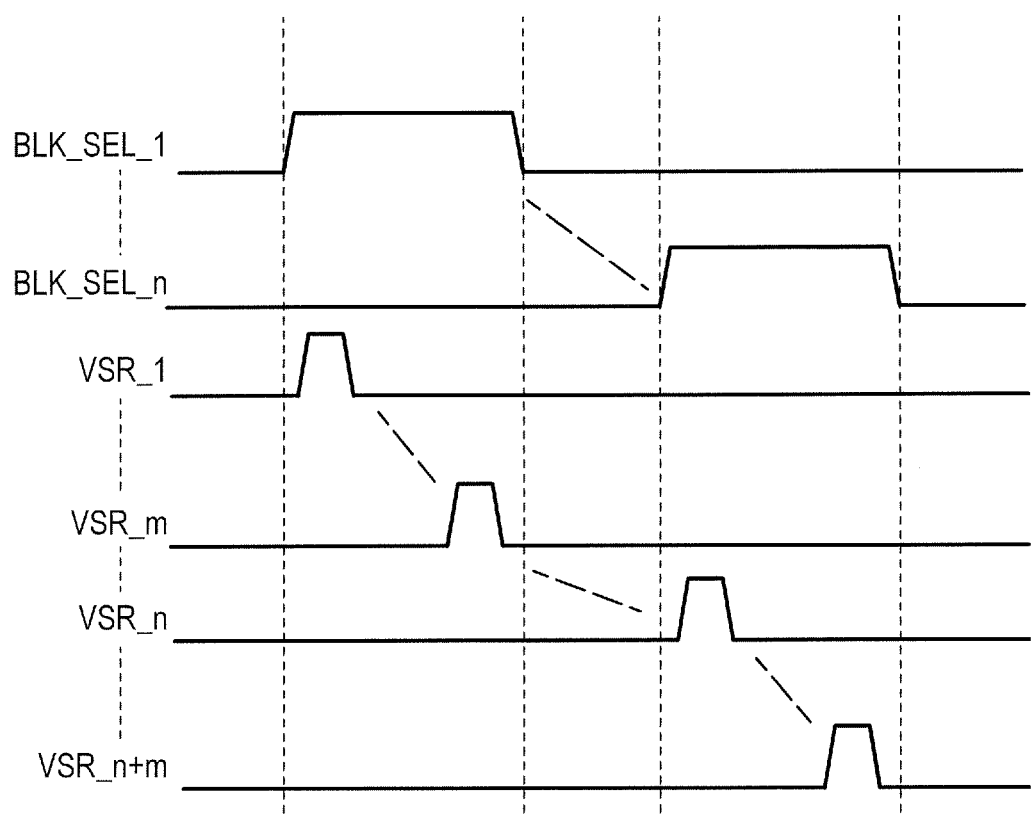
FIG. 2 is a view illustrating driving timings in the first embodiment.

A method of driving each pixel circuit 2 illustrated in FIG. 1 is the same as a driving method of a general CMOS type solid-state imaging device, so an explanation thereof will be omitted. FIG. 2 illustrates the driving timings of control signals for controlling the pixel select transistor SEL and block select circuit 5. In FIG. 2, a signal VSR_i correspond to a control signal for selecting the i-th pixel row illustrated in FIG. 1, and a signal BLK_SEL_j corresponds to a control signal for selecting the j-th block select circuit 5. Note that i and j are suffixes, i is an integer of 1 to n+m, and j is an integer of 1 to n (n and m are natural numbers).

When reading out a pixel signal from each pixel circuit 2, the control signal BLK_SEL_j of the block select circuit 5 of a block as a pixel signal readout target is raised. Then, the control signals VSR_i corresponding to the pixel circuits 2 as pixel signal readout targets in the block selected by the control signal BLK_SEL_j are raised one by one. By thus driving the control signals VSR_i and BLK_SEL_j, only the sub vertical output line 4 of the corresponding block is connected to the main vertical output line 3, and a pixel signal based on electric charge generated in the photoelectric conversion unit of the pixel circuit 2 is read out. Other blocks in the vertical direction are electrically disconnected from the main vertical output line 3.

In this embodiment as explained above, it is possible to reduce the load capacitance connected to the main vertical output line 3, and rapidly read out pixel signals.

Second Embodiment

Next, a second embodiment of the present invention will be explained below.

Figure 3:
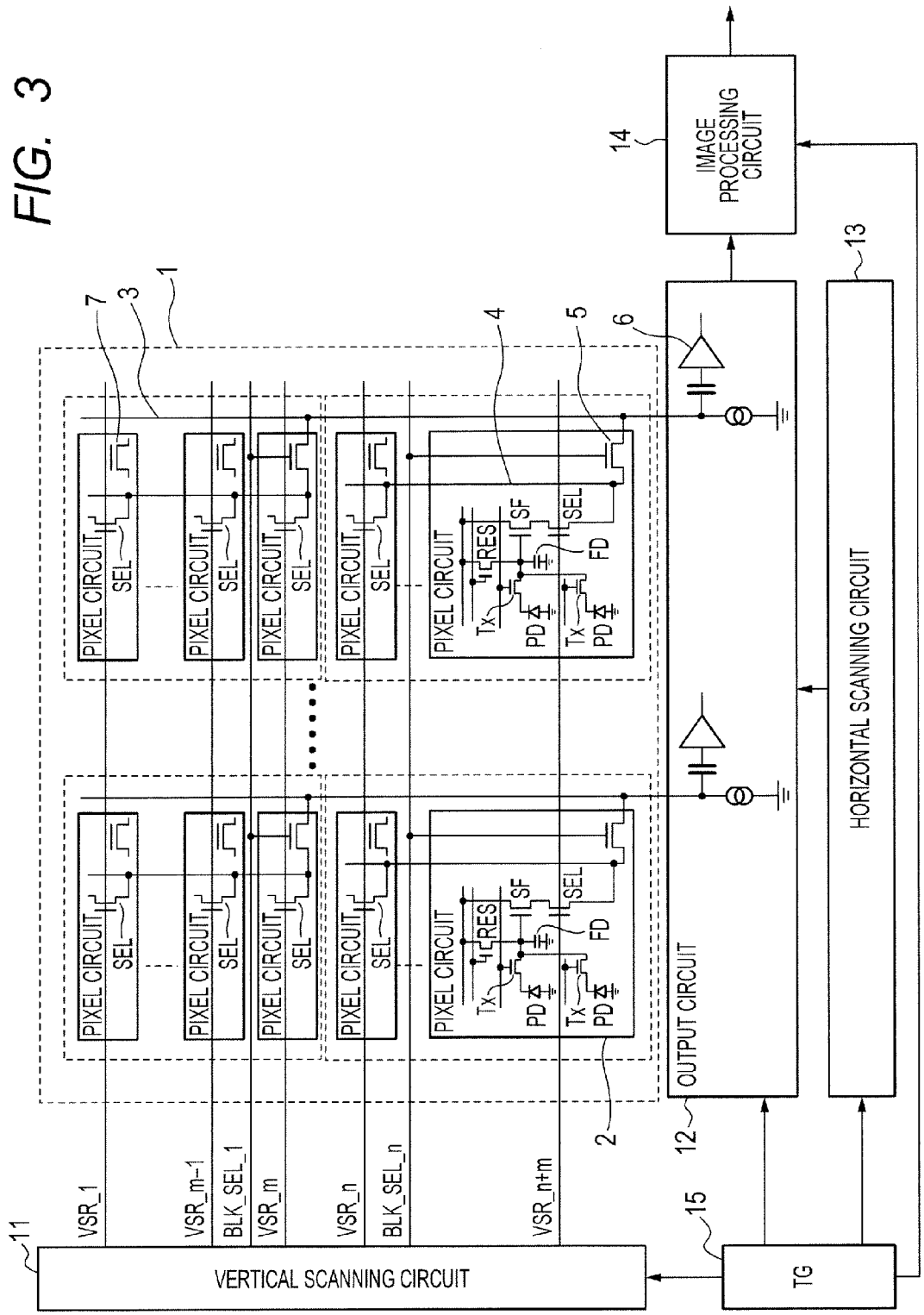
FIG. 3 is a view illustrating an arrangement example of a solid-state imaging device according to a second embodiment.

FIG. 3 is a view illustrating an arrangement example of a solid-state imaging device according to the second embodiment. The same reference numerals as in FIG. 1 denote the same constituent elements in FIG. 3, and a repetitive explanation will be omitted. Also, methods of driving pixel circuits 2 and block select circuits 5 of the solid-state imaging device according to the second embodiment are the same as those of the first embodiment, so an explanation thereof will be omitted.

In the above-described first embodiment, the block select circuit 5 is provided in a part of the unit pixel regions in a block of the unit pixel circuits. In the second embodiment, the block select circuits 5 are provided in all the unit pixel regions in which the pixel circuits 2 are formed. However, an actual electrical connection between the main vertical output line 3 and the sub vertical output line 4 is formed by using only the block select circuit 5 provided in a part of the unit pixel regions in the block of the unit pixel circuits, and an unused block select circuit is handled as a dummy circuit 7. In this embodiment, the dummy circuit 7 is a transistor, and a potential of its control node is being a floating state.

Consequently, parasitic capacitance connected to the vertical output line is reduced to only the parasitic capacitance of the transistor of the block select circuit 5. This makes it possible to reduce the load capacitance of the main vertical output line 3, and rapidly read out pixel signals. Also, even when the block select circuit 5 is formed in the unit pixel region where the pixel circuit 2 is formed, pixel output nonuniformity caused by the circuit layout hardly occurs. Note that the block select circuit 5 can be, e.g., a switching circuit, a source follower circuit, or a buffer circuit using a differential amplifier in this embodiment as well.

Third Embodiment

Next a third embodiment of the present invention will be explained below.

Figure 4:
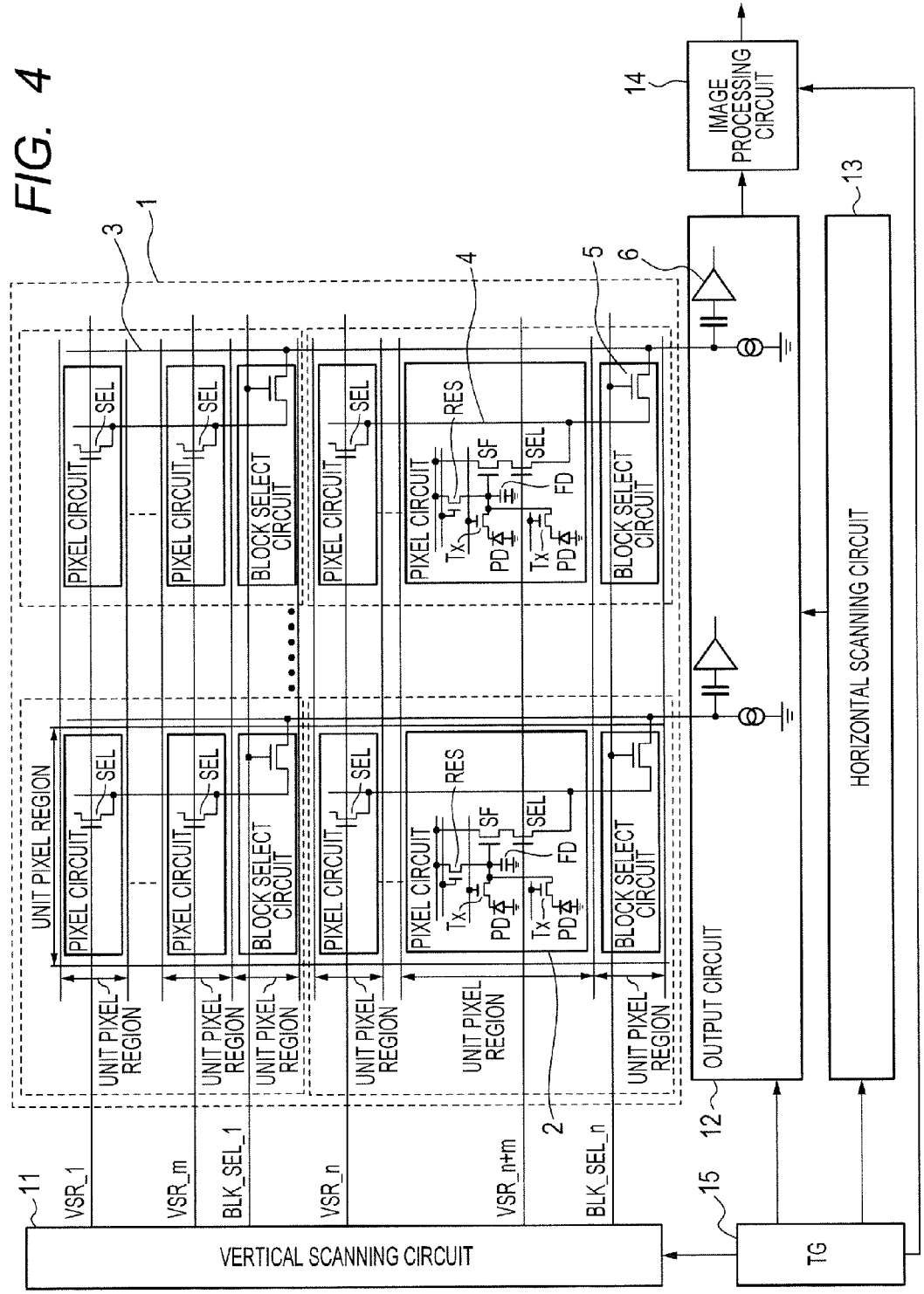
FIG. 4 is a view illustrating an arrangement example of a solid-state imaging device according to a third embodiment.

FIG. 4 is a view illustrating an arrangement example of a solid-state imaging device according to the third embodiment. The same reference numerals as in FIG. 1 denote the same constituent elements in FIG. 4, and a repetitive explanation will be omitted.

In the third embodiment, a block select circuit 5 for connecting a main vertical output line 3 and sub vertical output line 4 is arranged in one of the unit pixel regions where the pixel circuits 2 are to be arranged, for each block. Since parasitic capacitance connected to the vertical output line is reduced to only the parasitic capacitance of the transistor of the block select circuit 5 in this case as well, the load capacitance of the main vertical output line 3 is reduced, so high-speed pixel signal readout is possible. In this case, no pixel signal can be output from the unit pixel region where the block select circuit 5 exists. Therefore, an image processing circuit 14 complements a pixel signal of the unit pixel region where the block select circuit 5 is arranged by using a pixel signal from an adjacent (or nearby) pixel circuit 2.

Fourth Embodiment

Next, a fourth embodiment of the present invention will be explained below.

Figure 5:
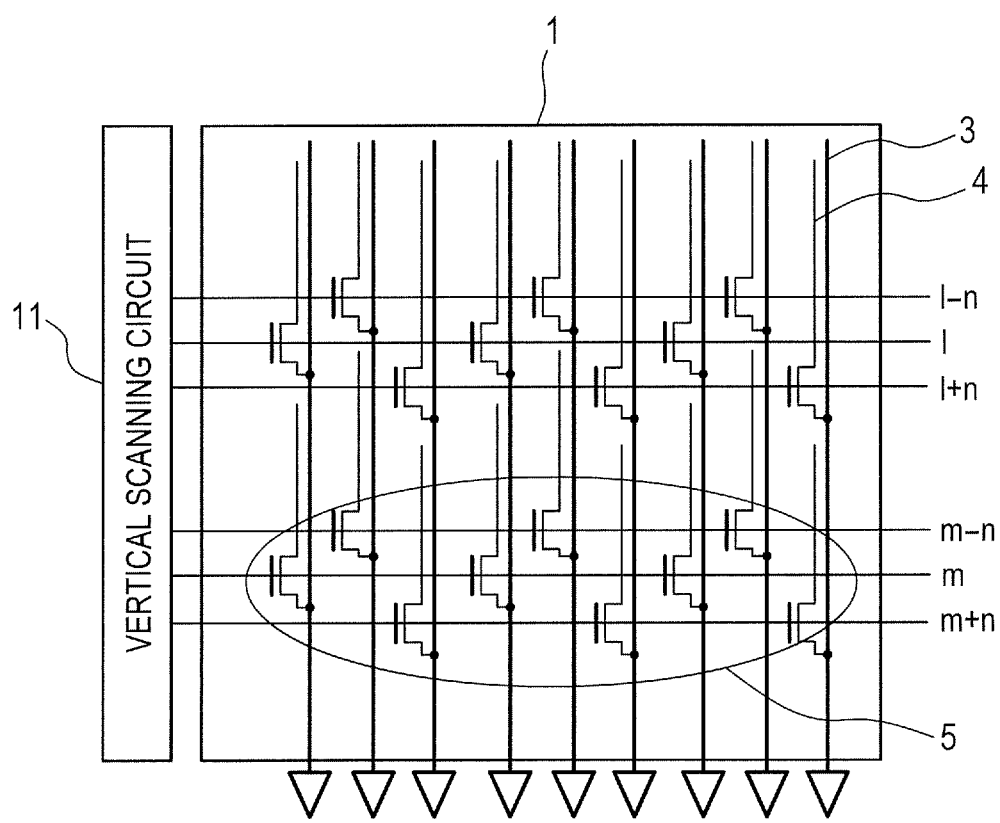
FIG. 5 is a view for explaining a solid-state imaging device according to a fourth embodiment.

FIG. 5 is a view for explaining a solid-state imaging device according to the fourth embodiment. Note that FIG. 5 illustrates only main vertical output lines 3, sub vertical output lines 4, and block select circuits 5 in a pixel array 1, and a vertical scanning circuit 11, but the rest of the arrangement not illustrated in FIG. 5 is the same as that of the first embodiment.

In the fourth embodiment, the driving addresses of the block select circuit 5 in the vertical direction are not fixed but varied. FIG. 5 illustrates, as an example, a case in which the addresses of the block select circuit 5 in the vertical direction are varied by ±n pixels with respect to l and m. Thus, the block select circuits 5 are discretely arranged, and addresses for selecting the block select circuits 5 of the vertical output line are scattered. This makes it difficult to visually recognize fixed pattern noise caused by the layout of the block select circuits 5.

Figure 6A:
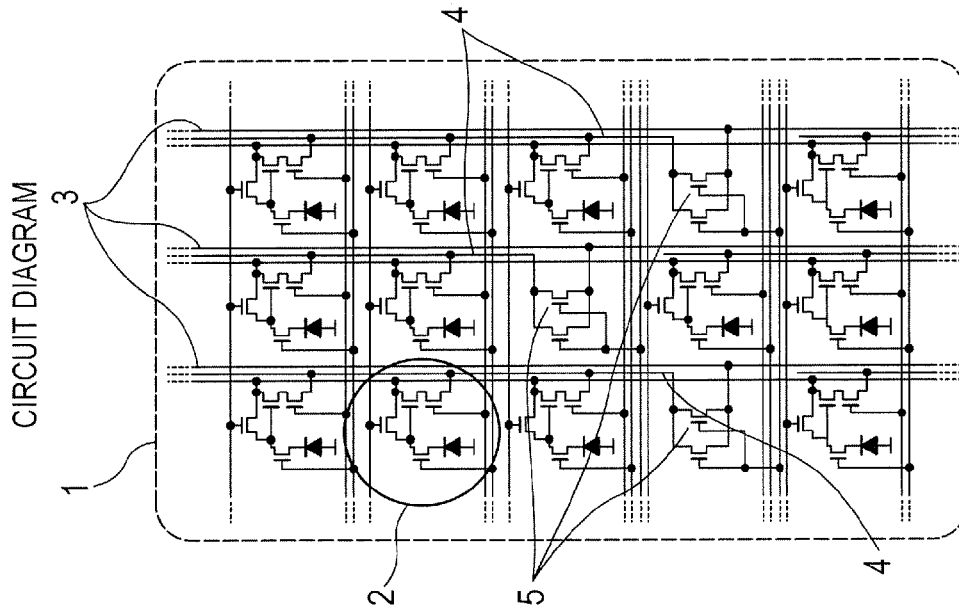
FIG. 6A is a view illustrating the layout of a pixel array in the fourth embodiment.
Figure 6B:
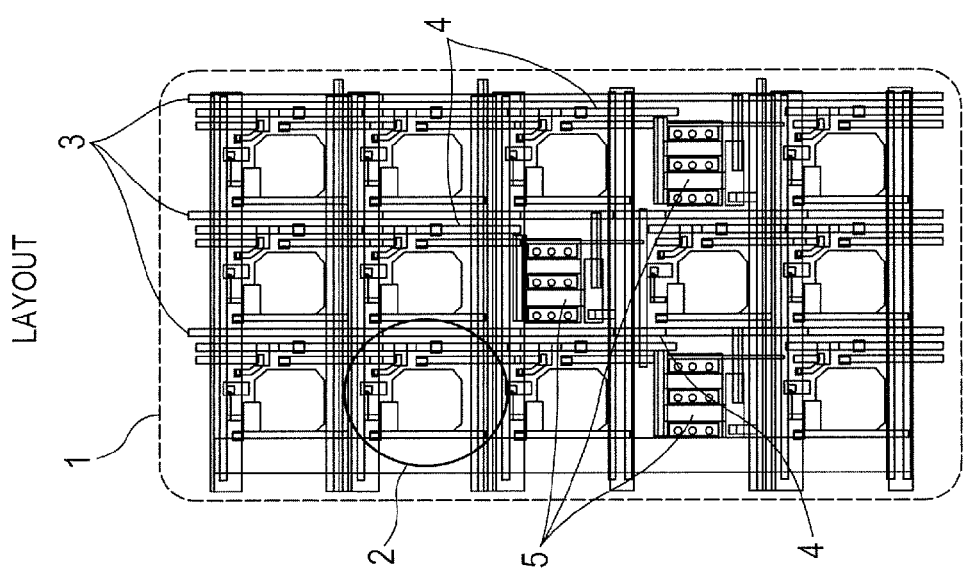
FIG. 6B is a view illustrating the circuit configuration of the pixel array in the fourth embodiment.

FIGS. 6A and 6B respectively illustrate examples of the layout and circuit configuration of the pixel array according to the fourth embodiment. In the examples illustrated in FIGS. 6A and 6B, the block select circuits 5 are replaced with the pixel circuits 2, and the addresses of the block select circuits 5 in the vertical direction are dispersed by one pixel. Note that in this case, no pixel signal can be output from the unit pixel region where the block select circuit 5 exists, so an image processing circuit 14 complements this in the same manner as in the third embodiment.

An arrangement capable of outputting a pixel signal as in the first or second embodiment is also possible. Furthermore, the block select circuits 5 may be provided in some unit pixel regions, or circuit patterns may be formed in all the unit pixel regions as in the second embodiment. In addition, the number of stages of blocking and the addresses of the block select circuits in the vertical direction are not particularly limited to predetermined values. Also, the type of block select circuit is not limited to a switching circuit or buffer circuit.

Fifth Embodiment

Next, a fifth embodiment of the present invention will be explained below.

Figure 7:
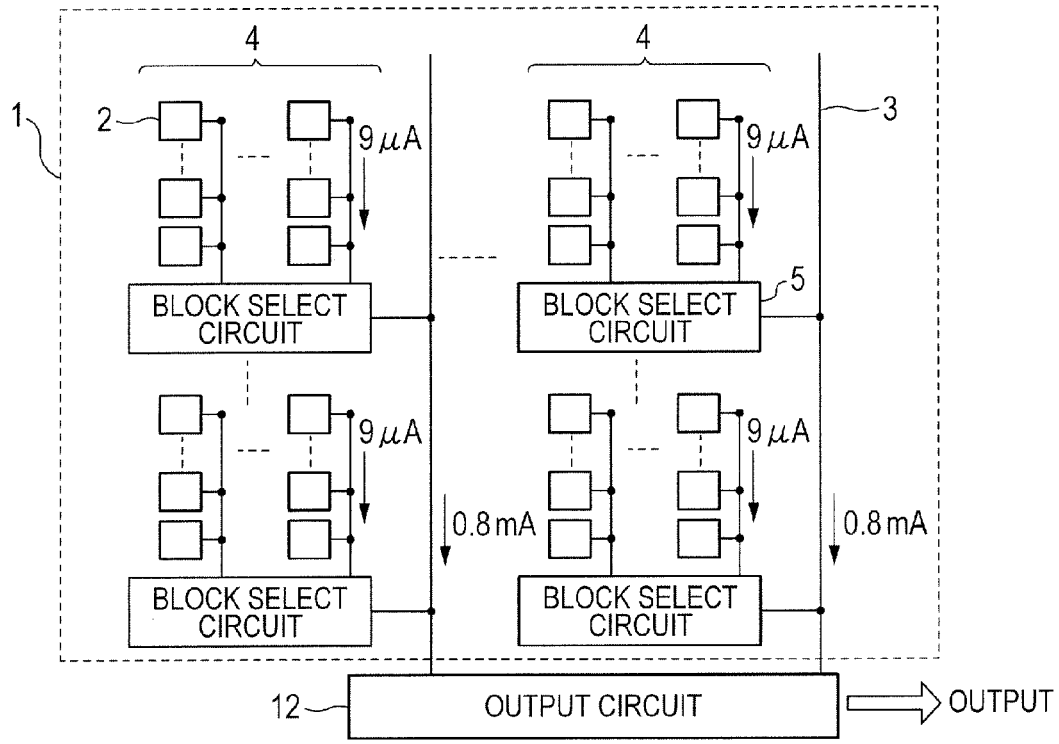
FIG. 7 is a view for explaining a solid-state imaging device according to a fifth embodiment.
Figure 8:
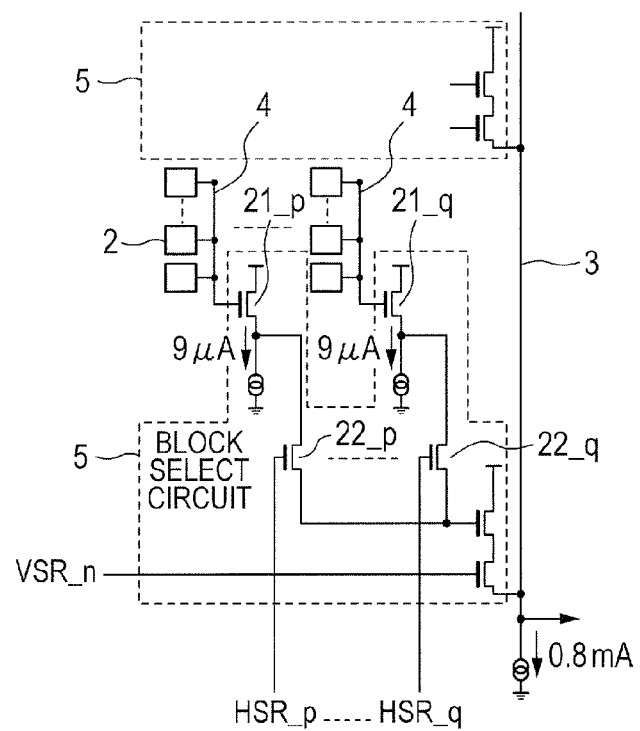
FIG. 8 is a view illustrating the arrangement of a block select circuit according to the fifth embodiment.

FIG. 7 is a view for explaining a solid-state imaging device according to the fifth embodiment. Note that FIG. 7 illustrates pixel circuits 2, main vertical output lines 3, sub vertical output lines 4, and block select circuits 5 in a pixel array 1, and an output circuit 12. FIG. 8 illustrates an arrangement example of the block select circuit 5 in the fifth embodiment.

In the fifth embodiment, a plurality of sub vertical output lines 4 corresponding to different pixel columns are connected to the block select circuit 5. Accordingly, the main vertical output line 3 is shared by a plurality of columns, so the effective area of the pixel circuit 2 can be increased. In the block select circuit 5 illustrated in FIG. 8, buffer circuits 21_p to 21_q are provided between the pixel circuits, and buffer circuits are provided between the main vertical output lines. Of the plurality of sub vertical output lines 4, the sub vertical output lines 4 to be connected to the main vertical output line 3 are selected by using switching circuits 22_p to 22_q controlled by control signals HSR_p to HSR_q.

When the solid-state imaging device has a large area, the path of the vertical output line from the pixel circuit 2 to the output circuit 12 prolongs, and the resistance and parasitic capacitance of the interconnection increase. Accordingly, a driving current amount must be increased in order to rapidly drive the vertical output line. However, the power consumption increases if the driving current is increased for all the vertical output lines. In this embodiment, therefore, a large driving current (as an example, 0.8 mA by a second current source) is supplied to only the main vertical output line 3, and the driving current of the sub vertical output line 4 is suppressed (as an example, 9 μA by a first current source). Then, a plurality of sub vertical output lines 4 are driven as they are switched by a control signal VSR_n and control signals HSR_p to HSR_q. This makes it possible to increase the driving speed of the vertical output line and reduce the power consumption at the same time.

Sixth Embodiment

Next, a sixth embodiment of the present invention will be explained below.

Figure 9:
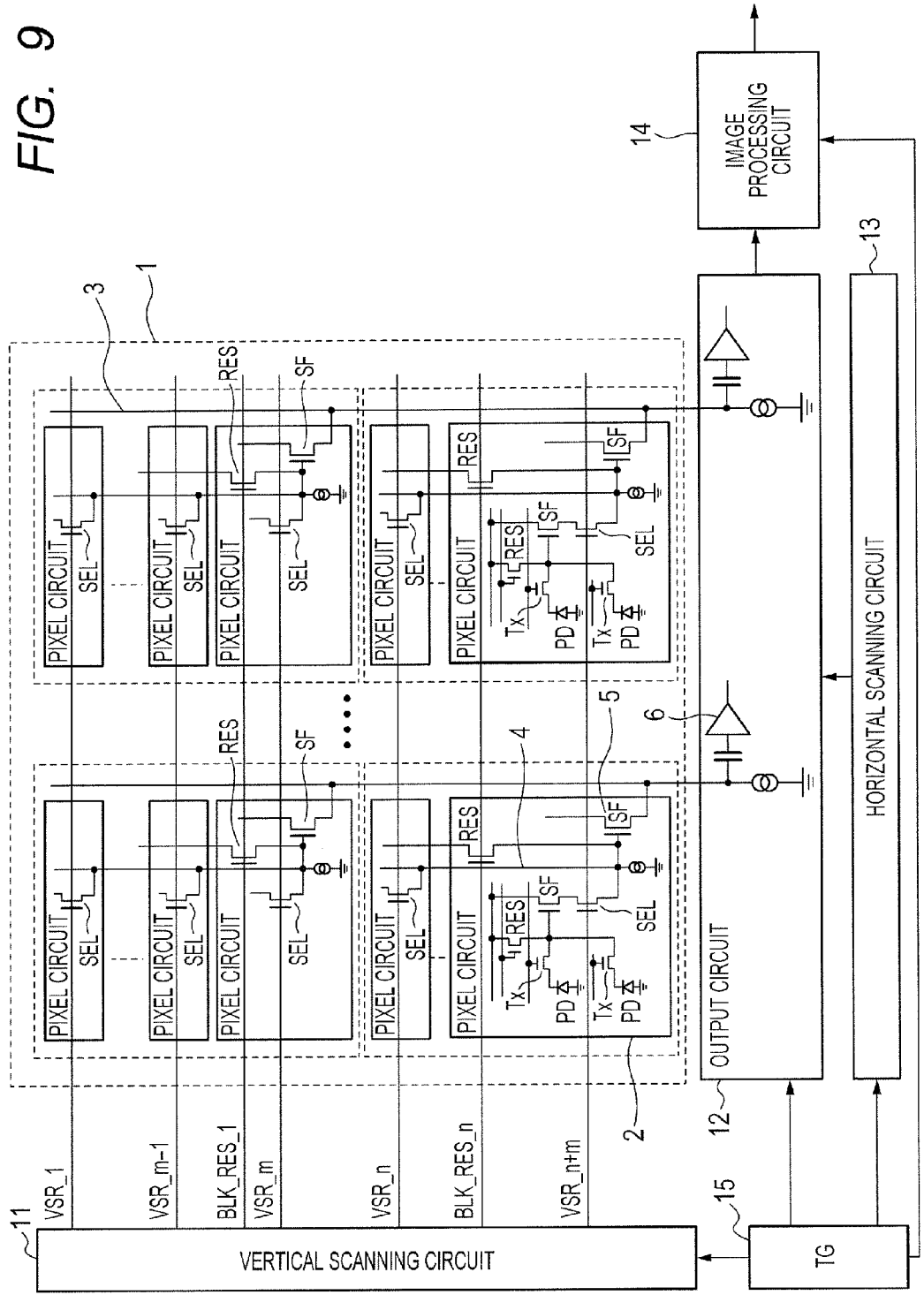
FIG. 9 is a view illustrating an arrangement example of a solid-state imaging device according to a sixth embodiment.

FIG. 9 is a view illustrating an arrangement example of a solid-state imaging device according to the sixth embodiment. The same reference numerals as in FIG. 1 denote the same constituent elements in FIG. 9, and a repetitive explanation will be omitted.

The solid-state imaging device according to the sixth embodiment is the same as the solid-state imaging device according to the first embodiment except that a source follower transistor SF is used as a block select circuit 5. A plurality of pixel circuits 2 in the vertical direction (a plurality of pixel circuits 2 in the same column) is blocked by the source follower transistor SF as the block select circuit 5.

By thus blocking the plurality of pixel circuits by the source follower circuit, capacitance connected to a vertical output line 3 can be reduced as in the first embodiment. In addition, since the source follower circuit is used as the block select circuit 5, the ON resistance when using a select transistor is reduced with respect to the vertical output line 3. This makes high-speed image signal readout possible. Note that a case in which the number of stages of the block select circuits 5 is one is taken as an example in this embodiment as well, but the number of stages of hierarchization and the number of divisions of hierarchized blocks are not particularly limited.

The source follower circuit forming the select circuit is switched between a selected state and unselected state by setting the potential of the gate node (control node) by a reset unit RES. The source follower circuit forming the select circuit is selected by setting the potential of the gate node by the reset unit RES at a potential at which the circuit operates as a source follower circuit, and is not selected by setting the gate node potential at a potential at which the circuit does not operate as a source follower circuit.

In this embodiment, the select circuit is formed as the source follower circuit. However, it is also possible to omit a select transistor SEL between the source follower transistor connected to a photoelectric conversion element PD via a transfer transistor Tx and the select circuit. Like the select circuit, the source follower transistor SF can be switched between the selected state and unselected state by setting the potential of the gate node (control node) by the reset transistor RES in this case as well.

Seventh Embodiment

Next, a seventh embodiment of the present invention will be explained below.

Figure 10:
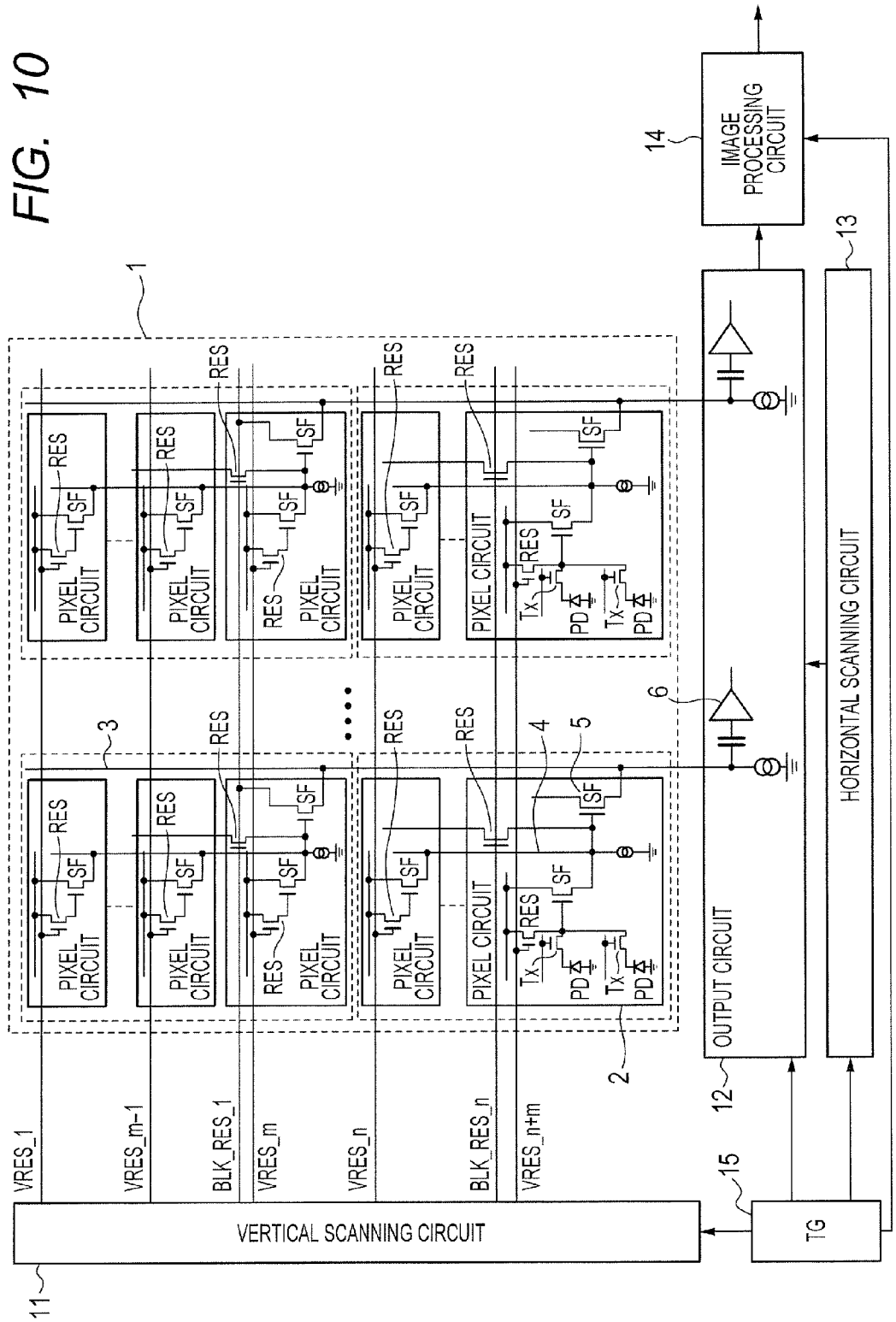
FIG. 10 is a view illustrating an arrangement example of a solid-state imaging device according to a seventh embodiment.

FIG. 10 is a view illustrating an arrangement example of a solid-state imaging device according to the seventh embodiment. The same reference numerals as in FIGS. 1 and 9 denote the same constituent elements in FIG. 10, and a repetitive explanation will be omitted.

The solid-state imaging device according to the seventh embodiment is the same as the solid-state imaging device according to the first embodiment except that, in a pixel circuit 2, a pixel select transistor arranged for every two pixels to be shared is not used, and a source follower transistor SF is used as a block select circuit. As in the sixth embodiment, a plurality of pixel circuits 2 in the vertical direction (a plurality of pixel circuits 2 in the same column) are blocked by the source follower transistor SF as the block select circuit 5.

By thus blocking the plurality of pixel circuits by the source follower circuit, capacitance connected to a vertical output line 3 is reduced as in the first and sixth embodiments. In addition, the source follower circuit is used to select each pixel circuit 2, in addition to the block select circuit 5. Therefore, the ON resistance when using a select transistor is reduced with respect to vertical output lines 3 and 4. This makes high-speed pixel signal readout feasible. Note that a case in which the number of stages of the block select circuits 5 is one is taken as an example in this embodiment as well, but the number of stages of hierarchization and the number of divisions of hierarchized blocks are not particularly limited.

Eighth Embodiment

Figure 11:
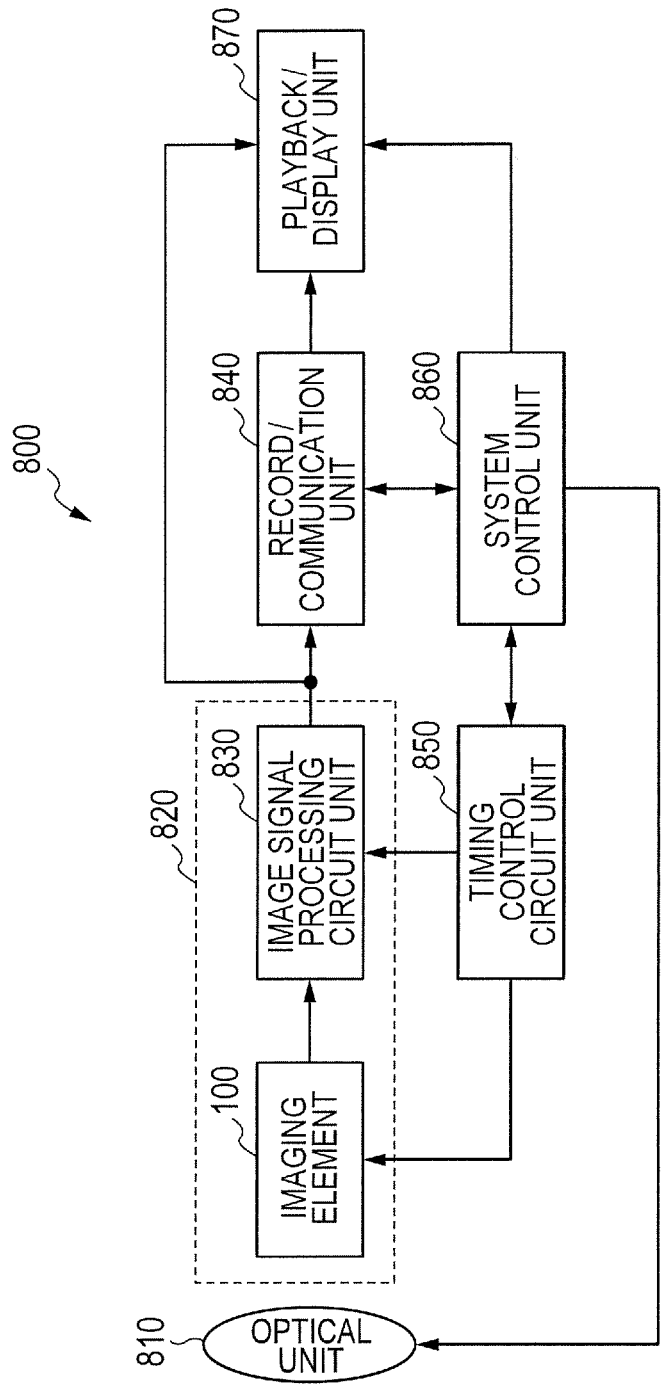
FIG. 11 is a view illustrating an arrangement example of an imaging system.

FIG. 11 is a view illustrating an arrangement example of an imaging system according to an eighth embodiment of the present invention. An imaging system 800 includes an optical unit 810, imaging element 100, image signal processing circuit unit 830, record/communication unit 840, timing control circuit unit 850, system control unit 860, and playback/display unit 870. An imaging device 820 includes the imaging element 100 and image signal processing circuit unit 830. The solid-state imaging device explained in each of the above-described embodiments is used as the imaging element 100.

The optical unit 810 as an optical system such as a lens images (concentrates) light from an object to a pixel unit 1 of the imaging element 100 where a plurality of pixels are two-dimensionally arranged, thereby forming an image of the object. The imaging element 100 outputs a signal corresponding to the light imaged on the pixel unit 1, at a timing based on a signal from the timing control circuit 850. The output signal from the imaging element 100 is input to the image signal processing circuit unit 830 as an image signal processor, and the image signal processing circuit unit 830 performs signal processing in accordance with a method determined by a program or the like. The signal obtained by the processing in the image signal processing circuit unit 830 is transmitted as image data to the record/communication unit 840. The record/communication unit 840 transmits a signal for forming an image to the playback/display unit 870, and causes the playback/display unit 870 to playback/display a moving image or still image. When receiving the signal from the image signal processing circuit unit 830, the record/communication unit 840 communicates with the system control unit 860, and also records a signal for forming an image on a recording medium (not illustrated).

The system control unit 860 comprehensively controls the operation of the imaging system, and controls the driving of the optical unit 810, the timing control circuit unit 850, the record/communication unit 840, and the playback/display unit 870. Also, the system control unit 860 includes a storage device (not illustrated) such as a recording medium, and records, e.g., programs necessary to control the operation of the imaging system in the storage device. Furthermore, the system control unit 860 supplies, e.g., a signal for switching driving modes in accordance with a user's operation to the imaging system. Practical examples are a change of a readout target row or reset target row, a change of the angle of view caused by electronic zooming, and a shift of the angle of view caused by electronic vibration isolation. The timing control circuit unit 850 controls the driving timings of the imaging element 100 and image signal processing circuit unit 830 under the control of the system control unit 860.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-033925, filed Feb. 25, 2014, which is hereby incorporated by reference herein in its entirety.

What is claimed is:

1. A solid-state imaging device comprising:
a plurality of unit pixel regions arranged in a matrix including a plurality of rows and a plurality of columns, wherein each of the plurality of unit pixel regions includes a pixel including a photoelectric conversion unit and a source follower circuit configured to output a signal corresponding to an electric charge generated in the photoelectric conversion unit, and
wherein the unit pixel regions arranged in one column are divided into a plurality of blocks;
a plurality of first output lines, each of the plurality of first output lines being connected to the source follower circuits of each of the unit pixel regions in one block and outputting pixel signals from the unit pixel regions in one block;
a plurality of select circuits provided respectively for the plurality of blocks; and
a second output line connected to the plurality of first output lines provided for the same column as the second output line via the plurality of select circuits.

2. The solid-state imaging device according to claim 1, wherein the select circuits are provided in a part of the plurality of unit pixel regions.

3. The solid-state imaging device according to claim 2, wherein a dummy select circuit not connected to the first output line is provided in the unit pixel region where the select circuit is not formed.

4. The solid-state imaging device according to claim 2, wherein the part of the plurality of unit pixel regions where the select circuit is provided are discretely arranged in a direction along the column of the matrix.

5. The solid-state imaging device according to claim 2, wherein the select circuits in adjacent columns are formed in the unit pixel regions in different rows.

6. The solid-state imaging device according to claim 1, further comprising:
a plurality of first current sources provided in one-to-one correspondence with the plurality of first output lines; and
a second current source provided for the second output line.

7. The solid-state imaging device according to claim 6, wherein a plurality of first output lines corresponding to different columns are connected to one select circuit.

8. The solid-state imaging device according to claim 1, wherein the select circuit includes a switching circuit or a buffer circuit.

9. The solid-state imaging device according to claim 1, wherein the pixel further includes a reset unit, and
the source follower circuit includes a control node configured to receive the electric charge generated in the photoelectric conversion unit, and switches the pixel between a selected state and an unselected state by setting a potential of the control node by the reset unit.

10. An imaging system comprising:
a solid-state imaging device according to claim 1; and
an image signal processing unit configured to process a signal output from the solid-state imaging device.

11. The solid-state imaging device according to claim 2, wherein no photoelectric conversion element is provided in the unit pixel region where the select circuit is formed.

12. The solid-state imaging device according to claim 1, wherein the pixel further includes a pixel select transistor.

* * * * *